US012333698B2

(12) United States Patent
Jang

(10) Patent No.: US 12,333,698 B2
(45) Date of Patent: Jun. 17, 2025

(54) IMAGE SENSING DEVICE

(71) Applicant: SK hynix Inc., Gyeonggi-do (KR)

(72) Inventor: Cheol Jon Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 615 days.

(21) Appl. No.: 17/333,644

(22) Filed: May 28, 2021

(65) Prior Publication Data

US 2022/0180498 A1 Jun. 9, 2022

(30) Foreign Application Priority Data

Dec. 9, 2020 (KR) .................. 10-2020-0170942

(51) Int. Cl.
G06T 7/00 (2017.01)
H04N 23/80 (2023.01)
H04N 25/76 (2023.01)
H10F 39/00 (2025.01)
H10F 39/18 (2025.01)

(52) U.S. Cl.
CPC ........... *G06T 7/0004* (2013.01); *H04N 23/80* (2023.01); *H04N 25/76* (2023.01); *H10F 39/18* (2025.01); *H10F 39/803* (2025.01); *G06T 2207/30108* (2013.01)

(58) Field of Classification Search
CPC ......... G06T 7/0004; G06T 2207/30108; G06T 7/40; G06T 1/20; G06T 5/00; H01L 27/14609; H01L 27/14643; H04N 23/80; H04N 25/76; H04N 25/63; H04N 25/68; H04N 25/683; H04N 25/70; H04N 5/30
USPC .................. 382/108, 275; 348/607
See application file for complete search history.

(56) References Cited

U.S. PATENT DOCUMENTS 6,157,730 A * 12/2000 Roever ................. G06T 7/0004
382/110
6,636,630 B1 * 10/2003 Adachi ................ G06V 30/413
358/448
8,731,323 B2 * 5/2014 Wang ..................... H04N 5/142
382/294
9,020,294 B2 * 4/2015 Leontaris ............. H04N 19/176
382/238
9,280,806 B2 * 3/2016 Shin .......................... G06T 5/70
(Continued)

FOREIGN PATENT DOCUMENTS

CN 102595061 A 7/2012
CN 104243767 A 12/2014
(Continued)

OTHER PUBLICATIONS

Office Action for the Chinese Patent Application No. 202111292254.1 issued by the Chinese Patent Office on Nov. 30, 2023.
(Continued)

*Primary Examiner* — Kathleen Y Dulaney
(74) *Attorney, Agent, or Firm* — IP & T GROUP LLP

(57) ABSTRACT

Disclosed is an image sensing device including an image sensor suitable for generating image values corresponding to a captured image, and an image processor suitable for analyzing a texture of a target kernel of the captured image based on a first image value corresponding to a center of the target kernel and second image values corresponding to a periphery of the target kernel among it mage values of the target kernel.

22 Claims, 4 Drawing Sheets

(56) References Cited

U.S. PATENT DOCUMENTS

| | | | |
|---|---|---|---|
| 9,578,320 B1* | 2/2017 | Li | H04N 25/68 |
| 2003/0081215 A1* | 5/2003 | Kumar | G01N 21/8983 |
| | | | 356/431 |
| 2004/0032516 A1* | 2/2004 | Kakarala | H04N 25/68 |
| | | | 382/300 |
| 2004/0042648 A1* | 3/2004 | Yoshidda | G06T 7/12 |
| | | | 382/151 |
| 2004/0218808 A1* | 11/2004 | Prince | H05K 3/1216 |
| | | | 382/150 |
| 2005/0276504 A1 | 12/2005 | Chui et al. | |
| 2006/0012694 A1* | 1/2006 | Yoneda | H04N 25/683 |
| | | | 348/E5.081 |
| 2008/0050010 A1* | 2/2008 | Hiroshima | G03F 1/84 |
| | | | 382/144 |
| 2008/0106647 A1* | 5/2008 | Kimura | H04N 17/00 |
| | | | 348/180 |
| 2008/0144922 A1* | 6/2008 | Naiki | G03F 9/7088 |
| | | | 382/145 |
| 2008/0317379 A1* | 12/2008 | Steinberg | H04N 9/8042 |
| | | | 382/275 |
| 2010/0027905 A1* | 2/2010 | Zhang | G06T 5/70 |
| | | | 348/241 |
| 2010/0290532 A1* | 11/2010 | Yamamoto | H04N 19/117 |
| | | | 375/E7.123 |
| 2011/0122299 A1* | 5/2011 | Tatsuzawa | H04N 25/68 |
| | | | 348/E9.042 |
| 2013/0051665 A1 | 2/2013 | Shinozaki | |
| 2014/0192236 A1 | 7/2014 | Kolli | |
| 2015/0015754 A1 | 1/2015 | Fujita et al. | |
| 2016/0035069 A1* | 2/2016 | Min | G06T 5/20 |
| | | | 382/266 |
| 2017/0011502 A1* | 1/2017 | Kobayashi | G06T 7/41 |
| 2017/0054910 A1 | 2/2017 | Moriuchi et al. | |
| 2017/0374305 A1* | 12/2017 | Kostrzewa | H04N 25/20 |
| 2020/0145572 A1 | 5/2020 | Adler et al. | |
| 2023/0410269 A1* | 12/2023 | Wang | G06T 7/11 |

FOREIGN PATENT DOCUMENTS

| | | |
|---|---|---|
| CN | 108965749 A | 12/2018 |
| JP | 2008-128651 A | 6/2008 |
| JP | 2008-278243 A | 11/2008 |
| JP | 2014-049780 A | 3/2014 |
| JP | 2015-19293 A | 1/2015 |
| KR | 10-2007-0109501 A | 11/2007 |
| KR | 10-0780224 | 11/2007 |
| KR | 10-2012-0066252 A | 6/2012 |

OTHER PUBLICATIONS

Notice of Allowance for the Korean Patent Application No. 10-2020-0170942 issued by the Korean Intellectual Property Office on Aug. 27, 2023.

Office Action for the Korean Patent Application No. 10-2020-0170942 issued by the Korean Patent Office on Dec. 12, 2022.

Office Action for the Chinese Patent Application No. 202111292254.1 issued by the Chinese Patent Office on May 17, 2024.

* cited by examiner

IMAGE SENSING DEVICE

CROSS-REFERENCE TO RELATED APPLICATION(S)

This application claims priority under 35 U.S.C. § 119 to Korean Patent Application No. 10-2020-0170942, filed on Dec. 9, 2020, the disclosure of which is incorporated herein by reference in its entirety.

BACKGROUND

1. Field

Various embodiments of the present disclosure relate to a semiconductor design technique, and more particularly, to an image sensing device.

2. Description of the Related Art

Image sensing devices are devices for capturing images using the property of a semiconductor which reacts to light. Image sensing devices may be roughly classified into charge-coupled device (CCD) image sensing devices and complementary metal-oxide semiconductor (CMOS) image sensing devices. Recently, CMOS image sensing devices are widely used because the CMOS image sensing devices can allow both analog and digital control circuits to be directly implemented on a single integrated circuit (IC).

SUMMARY

Various embodiments of the present disclosure are directed to an image sensing device that uses a simple calculation method when analyzing a texture of a target kernel.

In addition, various embodiments of the present disclosure are directed to an image sensing device capable of omitting a correction operation according to an analysis result of a target kernel.

In accordance with an embodiment of the present disclosure, an image sensing device may include: an image sensor suitable for generating image values corresponding to a captured image; and an image processor suitable for analyzing a texture of a target kernel of the captured image based on a first image value corresponding to a center of the target kernel and second image values corresponding to a periphery of the target kernel among image values of the target kernel.

The image processor may be further suitable for analyzing whether a defective image value is present in the target kernel when analyzing the texture of the target kernel.

The image processor may omit an operation of correcting a defective image value of the target kernel when a result of the analyzing the texture of the target kernel indicates that the target kernel is a texture region that is more complex than an edge region.

In accordance with an embodiment of the present disclosure, an image sensing device may include: an image sensor suitable for generating image values corresponding to a captured image; and an image processor suitable for analyzing a texture for a target kernel corresponding to N×N pixels, where "N" is an integer greater than 1, based on image values of pixels having the same color filter among image values of the target kernel.

The image processor may analyze the texture of the target kernel based on a first image value corresponding to a center of the target kernel and second image values corresponding to a periphery of the target kernel among the image values of the target kernel.

The image processor may be further suitable for analyzing whether a defective image value is present in the target kernel while analyzing the texture of the target kernel.

The image processor may omit an operation of correcting a defective image value of the target kernel when a result of the analyzing the texture of the target kernel indicates that the target kernel is a texture region that is more complex than an edge region.

In accordance with an embodiment of the present disclosure, an image sensing device may include: a kernel analysis part suitable for analyzing a texture of a target kernel and whether one or more defective image values is present in the target kernel, and generating a control signal corresponding to a result of the analysis, based on some of image values of the target kernel; a kernel correction part suitable for correcting the defective image values of the target kernel based on the image values of the target kernel and the control signal, and generating the corrected image values; and an image output part suitable for outputting one of the image values of the target kernel and the corrected image values based on the control signal.

The some image values may include a first image value corresponding to a center of the target kernel and second image values corresponding to a periphery of the target kernel among the image values of the target kernel.

The kernel correction part may be enabled when the target kernel is a flat region or an edge region and the defective image value is present in the target kernel, wherein the kernel correction part may be disabled when the target kernel is the flat region or the edge region and the defective image value is not present in the target kernel, and wherein the kernel correction part may be disabled when the target kernel is a texture region that is more complex than the edge region.

In accordance with an embodiment of the present disclosure, an image sensing device may include: an image sensor suitable for generating a first image value corresponding to a center of a kernel of an image and second image values corresponding to a periphery of the kernel; and an image processor suitable for: generating first to third variance values based on the first image value and the second image values, determining a texture of the kernel and detecting a defective image value in the kernel, based on the first to third variance values, and correcting the defective image value when the kernel is one between a flat region and an edge region while skipping the correcting when the kernel is a more complex texture region than the edge region.

DETAILED DESCRIPTION

Various embodiments of the present disclosure are described in detail below with reference to the accompanying drawings, in order to describe in detail the present disclosure for those with ordinary skill in art to which the present disclosure pertains, to easily carry out the technical spirit of the present disclosure.

Throughout the specification, when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used herein, specify the presence of the stated elements and do not preclude the presence or addition of one or more other elements, unless otherwise described. In the following description, some components are described in the singular form, but the present disclosure is not limited thereto; it will be understood that components may be formed in plural.

Figure 1:
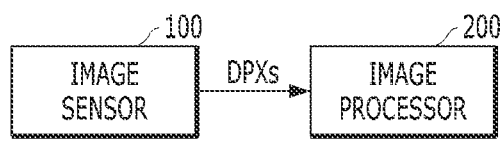
FIG. 1 is a block diagram illustrating an image sensing device in accordance with an embodiment of the present disclosure.

FIG. 1 is a block diagram illustrating an image sensing device in accordance with an embodiment of the present disclosure.

Referring to FIG. 1, the image sensing device may include an image sensor 100 and an image processor 200.

The image sensor 100 may generate image values DPXs corresponding to a captured image.

The image processor 200 may analyze a texture for each kernel of the captured image based on the image values DPXs. When analyzing the texture, the image processor 200 may simultaneously analyze whether there is a defective image value of a pixel in which a defect occurs in each target kernel.

The texture may be one of characteristics indicating whether a target kernel is a flat region, an edge region or a texture region (hereinafter, referred to as a "complex texture region") that is more complex than the edge region. The flat region may refer to a texture region that is simpler than the edge region, and the edge region may refer to a region including one of an edge in a horizontal direction, an edge in a vertical direction and an edge in a diagonal direction. The complex texture region may refer to a region including at least two of the edges in the horizontal, vertical and diagonal directions, or a region in which various colors are mixed without directionality.

The image processor 200 may determine whether to correct the defective image value in the target kernel based on a result of analyzing the texture of the target kernel and a result of analyzing whether the defective image value is present in the target kernel. For example, when the target kernel is the flat region or the edge region and the defective image value is present in the target kernel, the image processor 200 may perform an operation of correcting the defective image value in the target kernel. On the other hand, when the target kernel is the flat region or the edge region and the defective image value is not present in the target kernel, the image processor 200 may omit (or skip) the operation of correcting the defective image value. In addition, when the target kernel is the complex texture region, the image processor 200 may omit the operation of correcting the defective image value, regardless of whether the defective image value is present in the target kernel.

The operation of correcting the defective image value may include an operation of detecting the defective image value and an operation of restoring the detected defective image value to a non-defective image value. In an embodiment, the operation of correcting the defective image value, in particular, the operation of detecting the defective image value may be omitted according to the result of analyzing the texture and the result of analyzing whether the defective image value is present.

Figure 2:
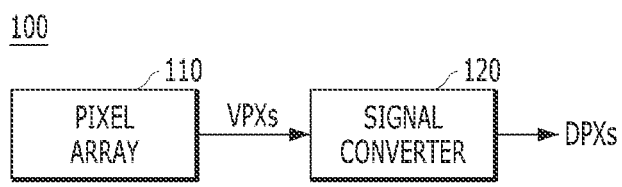
FIG. 2 is a block diagram illustrating an image sensor illustrated in FIG. 1.

FIG. 2 is a block diagram illustrating the image sensor 100 illustrated in FIG. 1.

Referring to FIG. 2, the image sensor 100 may include a pixel array 110 and a signal converter 120.

Figure 3:
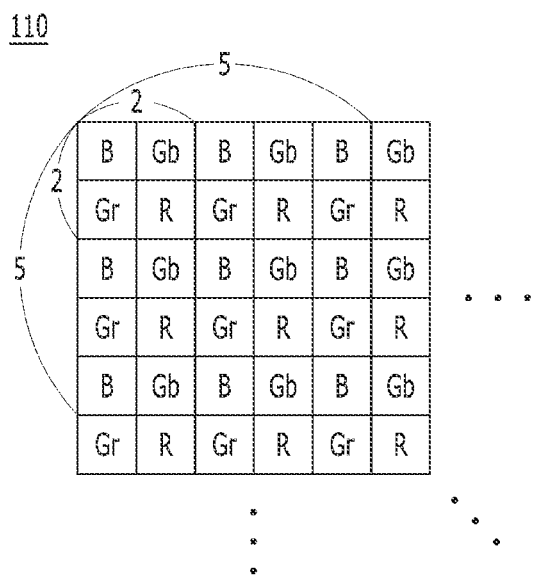
FIG. 3 is a diagram illustrating an example of a pixel array illustrated in FIG. 2.

The pixel array 110 may include a plurality of pixels arranged in a row direction and a column direction (refer to FIG. 3). The pixel array 110 may generate pixel signals VPXs for each row. For example, the pixel array 110 may generate the pixel signals VPXs from pixels arranged in a first row during a first row time, and generate the pixel signals VPXs from pixels arranged in an $n^{th}$ row during an $n^{th}$ row time, where "n" is an integer greater than 2. Each of the pixel signals VPXs may be an analog-type pixel signal.

The signal converter 120 may convert the analog-type pixel signals VPXs into the digital-type image values DPXs. For example, the signal converter 120 may include an analog-to-digital converter.

FIG. 3 is a diagram illustrating an example of the pixel array 110 illustrated in FIG. 2.

Referring to FIG. 3, the pixel array 110 may be arranged in a predetermined or set pattern. For example, the pixel array 110 may be arranged in a Bayer pattern. The Bayer pattern may be composed of repeating cells having 2×2 pixels. In each of the cells, two pixels Gr and Gb each having a green color filter may be disposed to diagonally face each other at corners thereof, and a pixel B having a blue color filter and a pixel R having a red color filter may be disposed at the other corners. The four pixels B, Gb, Gr and R are not necessarily limited to the arrangement structure illustrated in FIG. 3 but may be variously disposed based on the Bayer pattern described above.

In an embodiment, the pixel array 110 may be divided into 5×5 pixels. The 5×5 pixels may correspond to the target kernel. The size of the target kernel may be determined according to analysis performance of the texture and correction performance of the defective image value.

Figure 4:
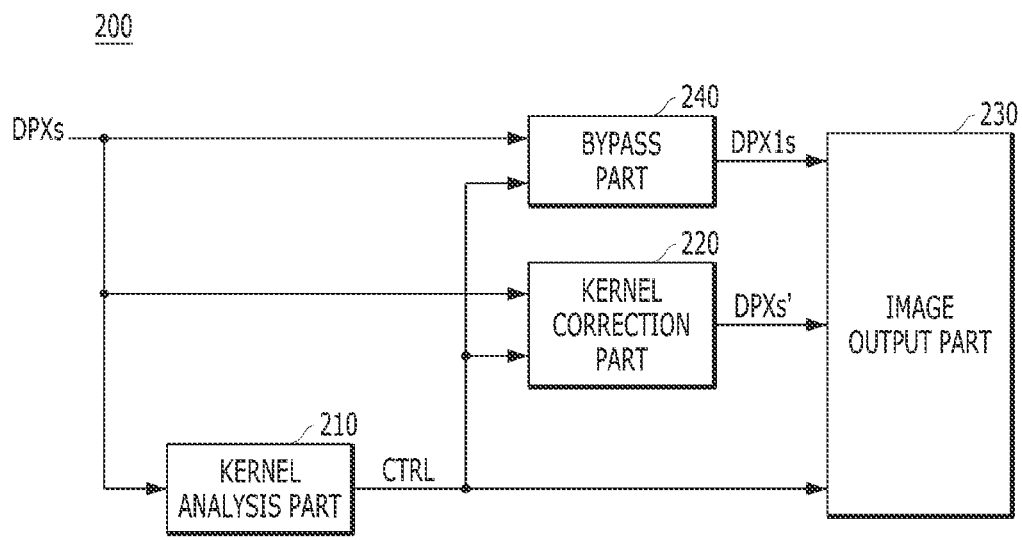
FIG. 4 is a block diagram illustrating an image processor illustrated in FIG. 1.

FIG. 4 is a block diagram illustrating the image processor 200 illustrated in FIG. 1.

Referring to FIG. 4, the image processor 200 may include a kernel analysis part 210, a kernel correction part 220, an image output part 230 and a bypass part 240.

The bypass part 240 may bypass the image values DPXs to the image output part 230 based on a control signal CTRL. The bypass part 240 may not be configured according to an embodiment, and the image values DPXs may be directly inputted to the image output part 230 when the bypass part 240 is not configured.

The kernel analysis part 210 may analyze a texture for each kernel of the captured image based on the image values DPXs. That is, the kernel analysis part 210 may analyze the characteristic of the region of the target kernel, and the region may be one of the flat region, the edge region and the complex texture region. The kernel analysis part 210 may analyze the texture of the target kernel by using some of the image values of the target kernel. For example, the kernel analysis part 210 may analyze the texture of the target kernel based on image values of pixels having the same color filter among the image values of the target kernel.

When analyzing the texture of the target kernel, the kernel analysis part 210 may also analyze whether the defective image value is present in the image values included in the target kernel. That is, the kernel analysis part 210 may simultaneously analyze the texture of the target kernel and whether the defective image value is present in the target kernel, through a single analysis operation.

The kernel analysis part 210 may generate the control signal CTRL corresponding to the target kernel based on a result of analyzing the texture of the target kernel and a result of analyzing whether the defective image value is present in the target kernel. The control signal CTRL may be a signal having a single bit having one of a high logic level and a low logic level.

The kernel correction part 220 may be enabled or disabled based on the control signal CTRL. When enabled, the kernel correction part 220 may generate corrected image values DPXs' corresponding to the target kernel, based on the image values DPXs.

For example, the kernel correction part 220 may be enabled when the target kernel is the flat region or the edge region and the defective image value is present in the target kernel. When enabled, the kernel correction part 220 may correct at least one defective image value among the image values of the target kernel. The kernel correction part 220 may detect the defective image value and restore the detected defective image value to a non-defective image value, based on some or all of the image values included in the target kernel according to a correction technique. For example, the correction technique may include a single defective pixel correction technique capable of detecting and restoring a maximum of one defective image value among the image values included in the target kernel, a couplet defective pixel correction technique capable of detecting and restoring a maximum of two defective image values among the image values included in the target kernel, and a triplet defective pixel correction technique capable of detecting and restoring a maximum of three defective image values among the image values included in the target kernel. On the other hand, the kernel correction part 220 may be disabled when the target kernel is the flat region or the edge region and the defective image value is not present in the target kernel. In addition, when the target kernel is the complex texture region, the kernel correction part 220 may be disabled regardless of whether the defective image value is present.

The image output part 230 may output one of bypassed image values DPX1s and the corrected image values DPXs' for each target kernel based on the control signal CTRL. For example, the image output part 230 may output the corrected image values DPXs' when the control signal CTRL has a level enabling the kernel correction part 220, and output the bypassed image values DPX1s when the control signal CTRL has a level disabling the kernel correction part 220.

Figure 5:
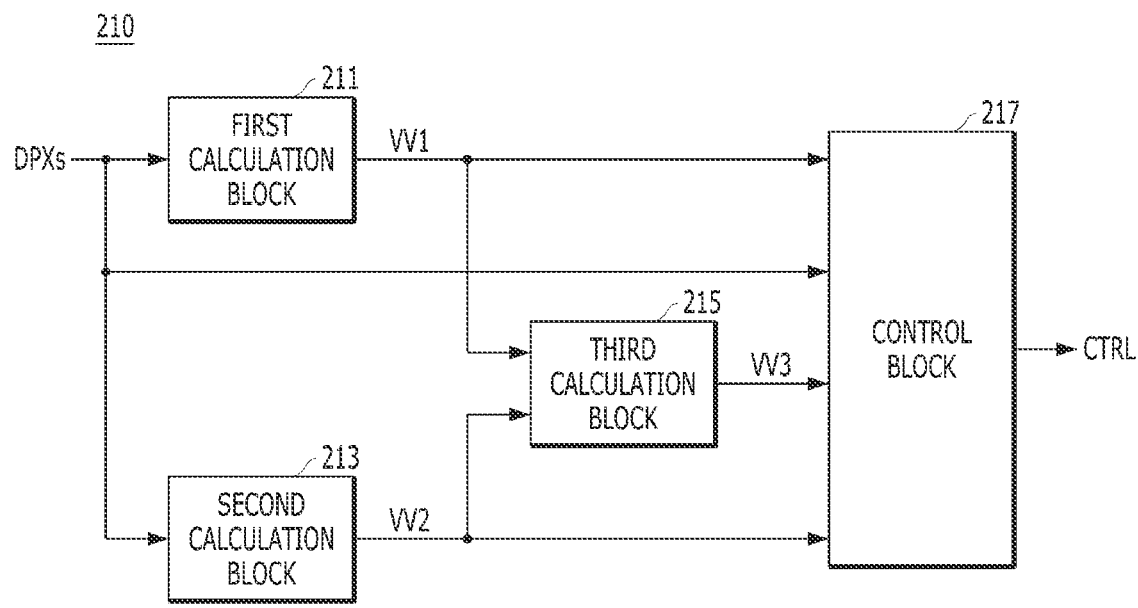
FIG. 5 is a block diagram illustrating a kernel analysis part illustrated in FIG. 4.

FIG. 5 is a block diagram illustrating the kernel analysis part 210 illustrated in FIG. 4.

Referring to FIG. 5, the kernel analysis part 210 may include a first calculation block 211, a second calculation block 213, a third calculation block 215 and a control block 217.

The first calculation block 211 may calculate a first variance value VV1 for each target kernel based on the image values DPXs. The first calculation block 211 may calculate the first variance value VV1 by using some of the image values included in the target kernel. For example, the first calculation block 211 may calculate the first variance value VV1 by using a first image value of a pixel disposed in the center of the target kernel and second image values of pixels disposed on the periphery of the target kernel. The first image value and the second image values may be image values of pixels having the same color filter. The first variance value VV1 will be described in more detail with reference to FIG. 7.

The second calculation block 213 may calculate a second variance value VV2 for each target kernel based on the image values DPXs. The second calculation block 213 may calculate the second variance value VV2 by using some of the image values included in the target kernel. For example, the second calculation block 213 may calculate the second variance value VV2 by using the second image values. The second variance value VV2 will be described in more detail with reference to FIG. 8.

The third calculation block 215 may generate a third variance value VV3 based on the first variance value VV1 and the second variance value VV2. For example, the third variance value VV3 may correspond to a difference value between the first variance value VV1 and the second variance value VV2.

The control block 217 may generate the control signal CTRL based on the first variance value VV1, the second variance value VV2, the third variance value VV3 and the image values DPXs. For example, the control signal CTRL may be generated according to "Table 1" below.

TABLE 1

| Texture | Whether defective image value is present | VV1 | VV2 | VV3 | CTRL |
|---|---|---|---|---|---|
| Flat region | O | ↑ | ↓ | ↑ | 1 |
|  | X | ↓ | ↓ | ↓ | 0 |
| Edge region | O | ↑ | ↑ | ↑ | 1 |
|  | X | ↓ | ↑ | ↓ | 0 |
| Complex texture region | O | ↑ | ↑ | ↓ | 0 |
|  | X |  |  |  |  |

In Table 1, the indication "↑" may refer to a relatively large value, the indication "↓" may refer to a relatively small value, the value of "1" may refer to a high logic level, and the value of "0" may refer to a low logic level.

The control block 217 may generate the control signal CTRL in which both the result of analyzing the texture of the target kernel and the result of analyzing whether the defective image value is present in the target kernel are reflected, based on the first variance value VV1, the second variance value VV2 and the third variance value VV3. For example, the control block 217 may determine whether the first variance value VV1 is a large value or a small value, by comparing the first variance value VV1 with a first reference value, determine whether the second variance value VV2 is a large value or a small value, by comparing the second variance value VV2 with a second reference value, and determine whether the third variance value VV3 is a large value or a small value, by comparing the third variance value VV3 with a third reference value. The first to third reference values may be different values, the same value or values in which different values and the same values are mixed. The control block 217 may recognize the result of analyzing the texture of the target kernel and the result of analyzing whether the defective image value is present in the target kernel, according to whether each of the first variance value VV1, the second variance value VV2 and the third variance value VV3 is a large or small value. In addition, the control block 217 may analyze more clearly whether the defective image value is present in the target kernel, based on the image values DPXs along with the first variance value VV1, the second variance value VV2 and the third variance value VV3 (see FIG. 6). The control block 217 may determine a logic level of the control signal CTRL corresponding to the target kernel, based on the result of analyzing the texture of the target kernel and the result of analyzing whether the defective image value is present in the target kernel.

Figure 6:
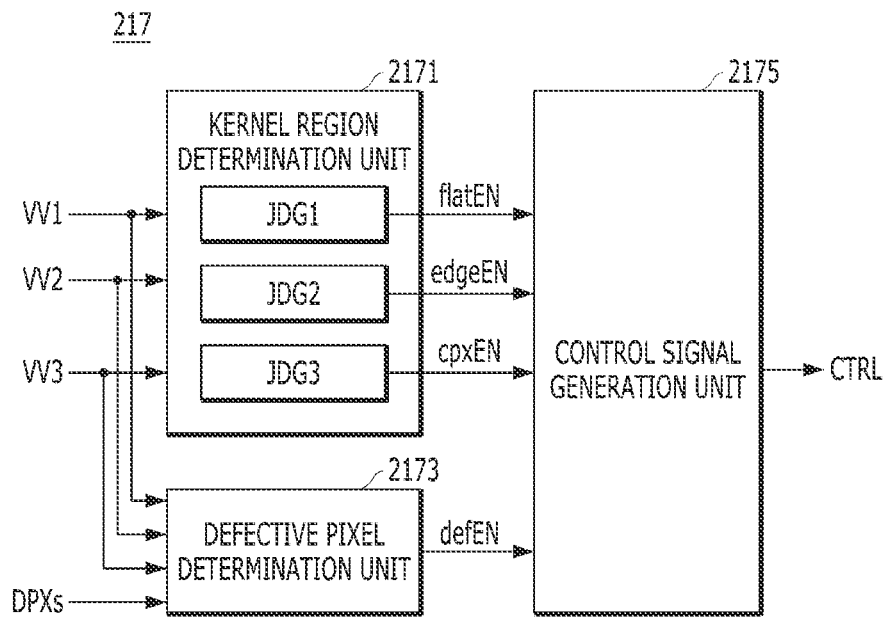
FIG. 6 is a block diagram illustrating a control block illustrated in FIG. 5.

FIG. 6 is a block diagram illustrating the control block 217 illustrated in FIG. 5.

Referring to FIG. 6, the control block 217 may include a kernel region determination unit 2171, a defective pixel determination unit 2173 and a control signal generation unit 2175.

The kernel region determination unit 2171 may generate a first region determination signal flatEN, a second region determination signal edgeEN and a third region determination signal cpxEN, which correspond to the result of analyzing the texture of the target kernel, based on the first variance value VV1, the second variance value VV2 and the third variance value VV3. The kernel region determination unit 2171 may include a first region determination component JDG1, a second region determination component JDG2 and a third region determination component JDG3. The first region determination component JDG1 may generate the first region determination signal flatEN corresponding to the flat region, based on the first variance value VV1, the second variance value VV2 and the third variance value VV3. The second region determination component JDG2 may generate the second region determination signal edgeEN corresponding to the edge region, based on the first variance value VV1, the second variance value VV2 and the third variance value VV3. The third region determination component JDG3 may generate the third region determination signal cpxEN corresponding to the complex texture region, based on the first variance value VV1, the second variance value VV2 and the third variance value VV3. The first region determination signal flatEN, the second region determination signal edgeEN and the third region determination signal cpxEN may be generated as shown in "Table 2" below.

TABLE 2

| Texture | VV1 | VV2 | VV3 | flatEN | edgeEN | cpxEN |
|---|---|---|---|---|---|---|
| Flat region | ↑ | ↓ | ↑ | 1 | 0 | 0 |
|  | ↓ | ↓ | ↓ | 1 | 0 | 0 |
| Edge region | ↑ | ↑ | ↑ | 0 | 1 | 0 |
|  | ↓ | ↑ | ↓ | 0 | 1 | 0 |
| Complex texture region | ↑ | ↑ | ↓ | 0 | 0 | 1 |

The defective pixel determination unit 2173 may generate a defect determination signal defEN corresponding to the result of analyzing whether the defective image value is present in the target kernel, based on the first variance value VV1, the second variance value VV2 and the third variance value VV3. The defective pixel determination unit 2173 may further improve a defect analysis capability based on the image values DPXs together with the first variance value VV1, the second variance value VV2 and the third variance value VV3. For example, the defective pixel determination unit 2173 may determine whether the defective image value is present in the target kernel, by comparing difference values between the first image value and the second image values with a threshold value. The threshold value may be set differently depending on whether the target kernel is the flat region, the edge region or the complex texture region. For example, the threshold value may be set based on the first variance value VV1, the second variance value VV2 and the third variance value VV3. The defect determination signal defEN may be generated as shown in "Table 3" below.

TABLE 3

| Texture | Whether defective image value is present | defEN | VV1 | VV2 | VV3 |
|---|---|---|---|---|---|
| Flat region | O | 1 | ↑ | ↓ | ↑ |
|  | X | 0 | ↓ | ↓ | ↓ |
| Edge region | O | 1 | ↑ | ↑ | ↑ |
|  | X | 0 | ↓ | ↑ | ↓ |
| Complex texture region | O | 1 | ↑ | ↑ | ↓ |
|  | X | 0 |  |  |  |

The control signal generation unit 2175 may generate the control signal CTRL based on the first region determination signal flatEN, the second region determination signal edgeEN, the third region determination signal cpxEN and the defect determination signal defEN.

Figure 7:
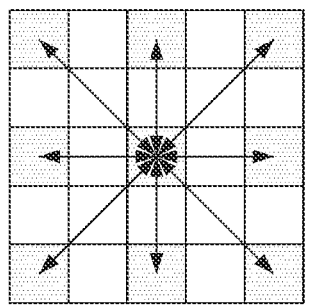
FIG. 7 is a diagram additionally illustrating a first calculation block illustrated in FIG. 5.

FIG. 7 is a diagram additionally illustrating the first calculation block 211 illustrated in FIG. 5.

Referring to FIG. 7, the target kernel may correspond to 5×5 pixels. The first calculation block 211 may calculate the first variance value VV1 by using the first image value and the second image values. The first image value may be an image value of one pixel disposed in the center of the target kernel, and the second image values may be image values of eight pixels disposed on the periphery of the target kernel.

The first calculation block 211 may calculate the first variance value VV1 based on the first image value of one pixel disposed in the center of the target kernel and the second image values of the eight pixels disposed on the periphery of the target kernel. The first variance value VV1 may be calculated according to "Equation 1" below.

$$VV1 = \sum_{i=1}^{8} |CV - PVi| \quad \text{[Equation 1]}$$

Herein, "CV" may refer to the first image value, and "PVi" may refer to the second image values.

The first variance value VV1 may be obtained by summing difference values between the first image value and the second image values. That is, the first variance value VV1 may be obtained by adding all difference values between image values of two pixels disposed at both ends of each of eight arrows illustrated in FIG. 7.

Figure 8:
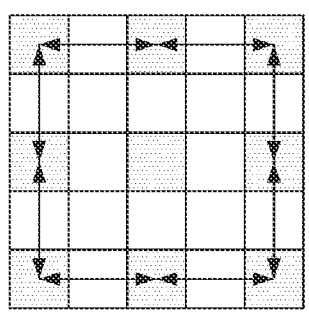
FIG. 8 is a diagram additionally illustrating a second calculation block illustrated in FIG. 5.

FIG. 8 is a diagram additionally illustrating the second calculation block 213 illustrated in FIG. 5.

Referring to FIG. 8, the target kernel may correspond to 5×5 pixels. The second calculation block 213 may calculate the second variance value VV2 by using the second image values. The second image values may be image values of eight pixels disposed on the periphery of the target kernel.

The second calculation block 213 may calculate the second variance value VV2 based on the second image values of the eight pixels disposed on the periphery of the target kernel. The second variance value VV2 may be calculated according to "Equation 2" below.

$$VV2 = |PV1 - PV2| + |PV2 - PV3| + \\ |PV3 - PV4| + |PV4 - PV5| + |PV5 - PV6| + \\ |PV6 - PV7| + |PV7 - PV8| + |PV8 - PV1|$$ [Equation 2]

Herein, "PV1", "PV2", "PV3", "PV4", "PV5", "PV6", "PV7" and "PV8" may refer to the second image values.

The second variance value VV2 may be obtained by summing difference values between the second image values. That is, the second variance value VV2 may be obtained by adding all difference values between image values of two pixels disposed at both ends of each of eight arrows illustrated in FIG. 8.

Hereinafter, examples of an operation of the image sensing device in accordance with an embodiment of the present disclosure, which has the above-described configuration, are described.

Figure 9:
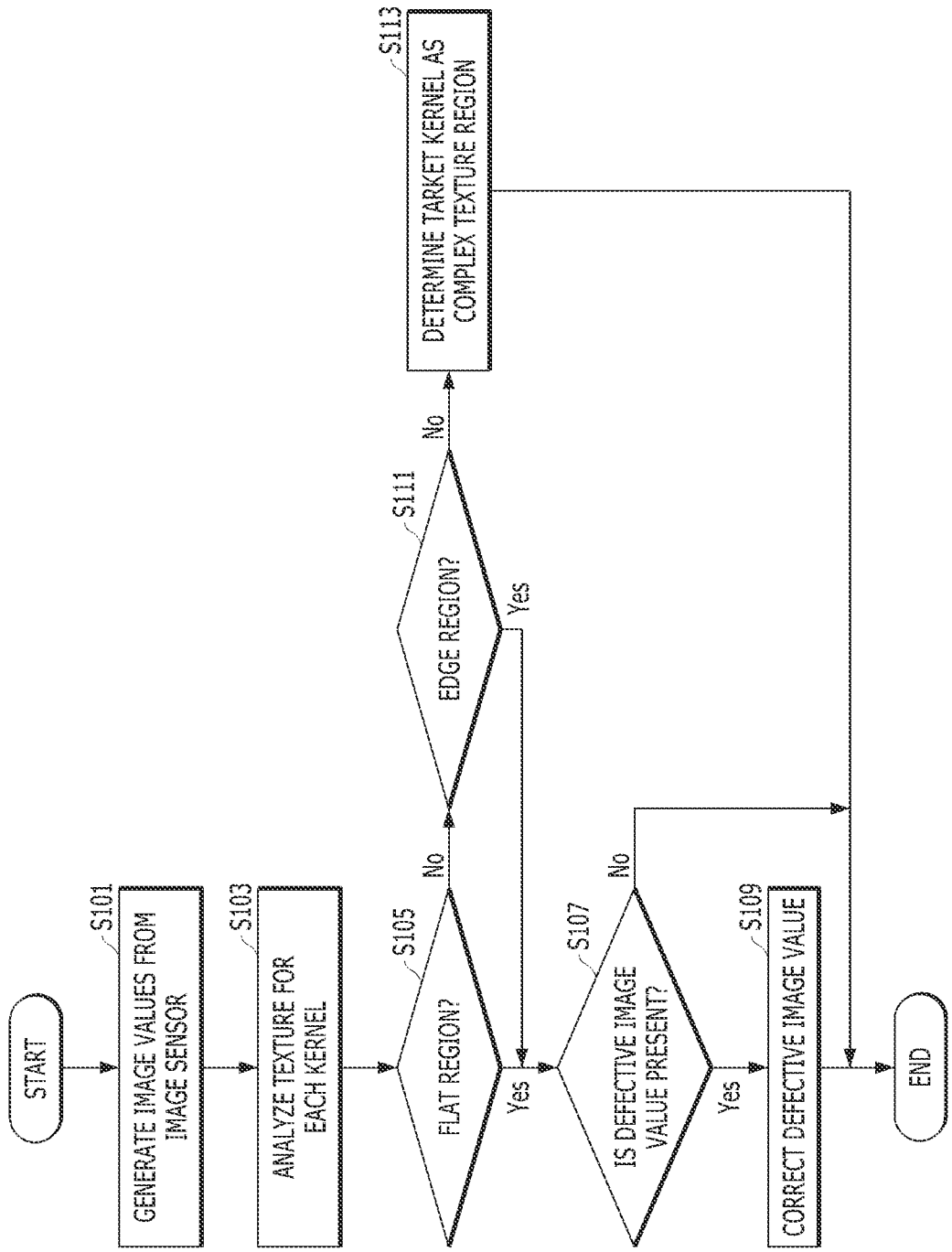
FIG. 9 is a flowchart illustrating an operation of the image sensing device illustrated in FIG. 1.

FIG. 9 is a flowchart illustrating the operation of the image sensing device illustrated in FIG. 1.

Referring to FIG. 9, the image sensor 100 may generate the image values DPXs corresponding to a captured image in operation S101.

The image processor 200 may analyze a texture for each kernel based on the image values DPXs, in operation S103. When analyzing the texture of a target kernel, the image processor 200 may also analyze whether a defective image value is present for the target kernel. The image processor 200 may simultaneously analyze the texture of the target kernel and whether the defective image value is present in the target kernel, through a single analysis operation. For example, the image processor 200 may calculate the first variance value VV1 of the target kernel according to "Equation 1" above, the second variance value VV2 of the target kernel according to "Equation 2" above, and the third variance value VV3 based on the first variance value VV1 and the second variance value VV2. The image processor 200 may analyze both the texture of the target kernel and whether the defective image value is present in the target kernel, based on the first variance value VV1, the second variance value VV2 and the third variance value VV3 (see "Table 1" above).

In operation S109, the image processor 200 may perform an operation of correcting the defective image value when the target kernel is the flat region (that is, "Yes" in operation S105) and the defective image value is present in the target kernel (that is, "Yes" in operation S107). Alternatively, in operation S109, the image processor 200 may perform the operation of correcting the defective image value when the target kernel is the edge region (that is, "Yes" in operation S111) and the defective image value is present in the target kernel (that is, "Yes" in operation S107).

On the contrary, the image processor 200 may omit the operation of correcting the defective image value when the target kernel is the flat region (that is "Yes" in operation S105) and the defective image value is not present in the target kernel (that is, "No" in operation S107). Alternatively, the image processor 200 may omit the operation of correcting the defective image value when the target kernel is the edge region (that is, "Yes" in operation S111) and the defective image value is not present in the target kernel (that is, "No" in operation S107). Alternatively, when it is determined in operation S113 that the target kernel is the complex texture region, the image processor 200 may omit the operation of correcting the defective image value regardless of whether the defective image value is present in the target kernel.

According to embodiments of the present disclosure, a variance value may be calculated by a simple calculation method, and a texture of a target kernel and whether a defective image value is in the target kernel may be easily analyzed based on the variance value.

According to embodiments of the present disclosure, low power consumption and high speed of an image sensing device may be realized by using a simple calculation method when analyzing a texture of a target kernel.

In addition, embodiments of the present disclosure, a correction operation may be omitted according to an analysis result of a target kernel, thereby further contributing to low power consumption and high speed of an image sensing device.

While the present disclosure has been illustrated and described with respect to specific embodiments, the disclosed embodiments are provided for description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. An image sensing device comprising:
    an image sensor suitable for generating image values corresponding to a captured image; and
    an image processor suitable for:
    analyzing a texture of a target kernel of the captured image based on first to third variance values,
    generating the first variance value based on a first image value corresponding to a center of the target kernel and second image values corresponding to a periphery of the target kernel among image values of the target kernel,
    generating the second variance value based on the second image values,
    generating the third variance value corresponding to a difference value between the first variance value and the second variance value, and
    omitting an operation of correcting a defective image value of the target kernel when a result of the analyzing the texture of the target kernel indicates that the target kernel is a texture region that is more complex than an edge region.

2. The image sensing device of claim 1, wherein the image processor is further suitable for analyzing whether a defective image value is present in the target kernel when analyzing the texture of the target kernel.

3. The image sensing device of claim 1, wherein the image processor includes:
    a kernel analysis part suitable for analyzing the texture of the target kernel and whether one or more defective image values is present in the target kernel, and generating a control signal corresponding to a result of the analysis, based on the first and second image values;
    a kernel correction part suitable for correcting the one or more defective images values of the target kernel based on at least the first and second image values of the target kernel and the control signal, and generating corrected image values; and
    an image output part suitable for outputting the image values of the target kernel or the corrected image values as output values based on the control signal.

4. The image sensing device of claim 3, wherein the kernel analysis part includes:
a first calculation block suitable for calculating the first variance value based on the first image value and the second image values;
a second calculation block suitable for calculating the second variance value based on the second image values;
a third calculation block suitable for calculating the third variance value based on the first and second variance values; and
a control block suitable for generating the control signal based on the first to third variance values.

5. The image sensing device of claim 3, wherein the kernel analysis part includes:
a first calculation block suitable for calculating the first variance value based on the first image value and the second image values;
a second calculation block suitable for calculating the second variance value based on the second image values;
a third calculation block suitable for calculating the third variance value based on the first and second variance values; and
a control block suitable for generating the control signal based on the first to third variance values and the first image value and the second image values.

6. The image sensing device of claim 1, wherein the first variance value is obtained by summing difference values between the first image value and the second image values.

7. The image sensing device of claim 1, wherein the second variance value is obtained by summing difference values between the second image values.

8. The image sensing device of claim 1, wherein the first and the second image values are part of image values corresponding to the target kernel.

9. An image sensing device comprising:
an image sensor suitable for generating image values corresponding to a captured image; and
an image processor suitable for:
analyzing a texture for a target kernel of the captured image based on first to third variance values,
generating the first variance value based on a first image value of a first pixel disposed in the center of the target kernel and second image values of second pixels having the same color filter as the first pixel among image values of the target kernel,
generating the second variance value based on the second image values,
generating the third variance value corresponding to a difference value between the first variance value and the second variance value, and
omitting an operation of correcting a defective image value of the target kernel when a result of the analyzing the texture of the target kernel indicates that the target kernel is a texture region that is more complex than an edge region.

10. The image sensing device of claim 9, wherein the first image value corresponds to a center of the target kernel among the image values of the target kernel, and the second image values correspond to a periphery of the target kernel among the image values of the target kernel.

11. The image sensing device of claim 9, wherein the image processor is further suitable for analyzing whether a defective image value is present in the target kernel while analyzing the texture of the target kernel.

12. The image sensing device of claim 9, wherein the image processor includes:
a kernel analysis part suitable for analyzing the texture of the target kernel to determine whether one or more defective image values is present in the target kernel, and generating a control signal corresponding to a result of the analysis, based on the first image value and the second image values;
a kernel correction part suitable for correcting the one or more defective image values of the target kernel based on at least the first and second image values of the target kernel and the control signal, and generating corrected image values; and
an image output part suitable for outputting the image values of the target kernel or the corrected image values as output values based on the control signal.

13. The image sensing device of claim 12, wherein the kernel analysis part includes:
a first calculation block suitable for calculating the first variance value based on the first image value and the second image values;
a second calculation block suitable for calculating the second variance value based on the second image values;
a third calculation block suitable for calculating the third variance value based on the first and second variance values; and
a control block suitable for generating the control signal based on the first to third variance values.

14. The image sensing device of claim 12, wherein the kernel analysis part includes:
a first calculation block suitable for calculating the first variance value based on the first image value and the second image values;
a second calculation block suitable for calculating the second variance value based on the second image values;
a third calculation block suitable for calculating the third variance value based on the first and second variance values; and
a control block suitable for generating the control signal based on the first to third variance values and the first and second image values.

15. The image sensing device of claim 9, wherein the first variance value is obtained by summing difference values between the first image value and the second image values, the second variance value is obtained by summing difference values between the second image values.

16. The image sensing device of claim 9, wherein the first and the second image values are part of image values corresponding to the target kernel.

17. An image sensing device comprising:
an image sensor; and
an image processor that performs the following;
analyzing, by a kernel analysis part, a texture of a target kernel and whether a defective image value is present in the target kernel, and generating a control signal corresponding to a result of the analysis, based on first and second image values of the target kernel; and
correcting, by a kernel correction part, the defective image value of the target kernel based on at least the first and second image values of the target kernel and the control signal, wherein the kernel correction part is enabled when the target kernel is a flat region or an edge region and the defective image value is present in the target kernel, wherein the kernel correction part is disabled when the target kernel is the flat region or the edge region and the defective image value is not present in the target kernel, and wherein the kernel correction part is disabled when the target kernel is a texture region that is more complex than the edge region, wherein the kernel analysis part performs the following:

calculating, by a first calculation block, a first variance value based on the first image value and the second image values;

calculating, by a second calculation block, a second variance value based on the second image values;

calculating, by a third calculation block, a third variance value based on the first and second variance values; and generating, with a control block, the control signal based on the first to third variance values.

18. The image sensing device of claim 17, wherein the first image value corresponds to a center of the target kernel among the image values of the target kernel, and the second image values correspond to a periphery of the target kernel among the image values of the target kernel.

19. The image sensing device of claim 17, wherein the first and the second image values are part of image values corresponding to the target kernel.

20. An image sensing device comprising:

an image sensor suitable for generating a first image value corresponding to a center of a kernel of an image and second image values corresponding to a periphery of the kernel; and an image processor suitable for:

generating first and second variance values based on the first image value and the second image values, generating a third variance value corresponding to a difference value between the first variance value and the second variance value, determining a texture of the kernel and detecting a defective image value in the kernel, based on the first to third variance values, and correcting the defective image value when the kernel is one between a flat region and an edge region while skipping the correcting when the kernel is a more complex texture region than the edge region.

21. The image sensing device of claim 20, wherein the first and the second image values are part of image values corresponding to the kernel.

22. The image sensing device of claim 20, wherein the image processor performs the correcting when the kernel is one between the flat region and the edge region and the defective image value is present in the kernel, while skips the correcting when the kernel is the more complex texture region or skips the correcting when the kernel is the flat region or the edge region and the defective image value is not present in the kernel.

* * * * *